United States Patent [19]
Ema

[11] Patent Number: 5,050,177
[45] Date of Patent: Sep. 17, 1991

[54] LASER DIODE DRIVING CIRCUIT

[75] Inventor: Hidetoshi Ema, Yokohama, Japan

[73] Assignee: Ricoh Company, Ltd., Tokyo, Japan

[21] Appl. No.: 610,582

[22] Filed: Nov. 8, 1990

[30] Foreign Application Priority Data

Nov. 22, 1989 [JP] Japan ................................. 1-304329

[51] Int. Cl.$^5$ ............................................... H01S 3/10
[52] U.S. Cl. ........................................ 372/38; 372/31
[58] Field of Search ........................... 372/38, 29, 31

[56] References Cited

U.S. PATENT DOCUMENTS

| | | | |
|---|---|---|---|
| 4,806,873 | 2/1989 | Nagano | 372/38 |
| 4,884,280 | 11/1989 | Kinoshita | 372/38 |
| 4,945,541 | 7/1990 | Nakayama | 372/38 |
| 4,945,542 | 7/1990 | Brothers | 372/38 |

FOREIGN PATENT DOCUMENTS 63-114285  5/1988  Japan .

Primary Examiner—James W. Davie
Attorney, Agent, or Firm—Oblon, Spivak, McClelland, Maier & Neustadt

[57] ABSTRACT

A laser diode driving circuit for driving a laser diode includes a driving transistor which controls a forward current of the laser diode, a photoelectric conversion element which receives an optical output of the laser diode and outputs a photocurrent proportional to the optical output, a converting circuit which converts an external light emission instruction signal into a light emission instruction signal current, and a source grounding circuit which amplifies a current which corresponds to a difference between the light emission instruction signal current from the converting circuit and the photocurrent from the photoelectric conversion element, so as to output an amplified current. This the source grounding circuit applies the amplified current to the driving transistor and controls the driving transistor so that the light emission instruction signal current becomes equal to the photocurrent.

7 Claims, 1 Drawing Sheet

LASER DIODE DRIVING CIRCUIT

BACKGROUND OF THE INVENTION

The present invention generally relates to driving circuits, and more particularly to a laser diode driving circuit.

A semiconductor laser which is made up of a laser diode is extremely compact and is capable of carrying out a direct modulation by a driving current at a high speed. For this reason, the semiconductor laser is popularly used as a light source of optical disk units, laser printers and the like.

However, the optioal output characteristic of the semiconductor laser with respect to the driving current changes greatly depending on the temperature. Hence, the temperature characteristic of the semiconductor laser becomes a big problem when setting the optical output of the semiconductor laser to a desired value. Various automatic power control (APC) circuits have been proposed to eliminate this problem and bring out the advantageous feature of the semiconductor laser. The previously proposed APC circuits ca roughly be categorized into the following three systems.

According to a first system, a light receiving element is provided to monitor the optical output of the semiconductor laser. The optical output of the semiconductor laser is controlled by forming a photoelectric negative feedback loop which constantly controls a forward current of the semiconductor laser so that a signal proportional to a photocurrent generated in the light receiving element becomes equal to a light emission level instruction signal.

According to a second system, a light receiving element is provided to monitor the optical output of the semiconductor laser. A forward current of the semiconductor laser is controlled so that a signal proportional to a photocurrent generated in the light receiving element during a predetermined power setting period becomes equal to a light emission level instruction signal. The forward current of the semiconductor laser which is set during this predetermined power setting period is stored during another period. During the predetermined power setting period, the optical output of the semiconductor laser is modulated by modulating the forward current of the semiconductor laser with reference to the stored forward current during a time in which information is added to the optical output of the semiconductor laser.

According to a third system, the temperature of the semiconductor laser is measured. The optical output of the semiconductor laser is controlled by controlling a forward current of the semiconductor laser depending on the measured temperature o by controlling the temperature of the semiconductor laser constant.

Out of the above described systems, the first system is preferable in order to set the optical output of the semiconductor laser to a desired value. However, the first system suffers from a problem in that the system cannot operate at a high speed.

As an improvement of the first system, a laser diode driving circuit was proposed in a Japanese Laid-Open Patent Application No. 63-114285. According to this proposed laser diode driving circuit, a light receiving element is provided to monitor the optical output of the semiconductor laser. The optical output of the semiconductor laser is controlled by forming a photoelectric negative feedback loop which drives a base of a bipolar transistor by a current which corresponds to a difference between a photocurrent generated in the light receiving element and a reference current.

However, according to this proposed laser diode driving circuit, a phase delay is introduced due to the frequency characteristic of the current amplification of the bipolar transistor. For example, when the current amplification of the bipolar transistor is 100 and the transition frequency is 5 GHz, a phase delay of 45° is introduced at approximately 50 MHz. For this reason, there are problems in that the frequency at which the loop gain of the photoelectric negative feedback loop becomes "1" cannot be set to a high frequency, and the optical output of the semiconductor laser cannot be controlled at a high speed.

SUMMARY OF THE INVENTION

Accordingly, it is a general object of the present invention to provide a laser diode driving circuit in which the problems described above are eliminated.

Another and more specific object of the present invention is to provide a laser diode driving circuit for driving a laser diode, comprising a driving transistor controlling a forward current of the laser diode, photoelectric conversion means for receiving an optical output of the laser diode and for outputting a photocurrent proportional to the optical output, converting means for converting an external light emission instruction signal into a light emission instruction signal current, and a source grounding circuit amplifying a current which corresponds to a difference between the light emission instruction signal current from the converting means and the photocurrent from the photoelectric conversion means, so as to output an amplified current, where the source grounding circuit applies the amplified current to the driving transistor and controls the driving transistor so that the light emission instruction signal current becomes equal to the photocurrent. According to the laser diode driving circuit of the present invention, it is possible to realize a high-speed circuit operation, that is, control the optical output of the laser diode at a high speed.

Other objects and further features of the present invention will be apparent from the following detailed description when read in conjunction with the accompanying drawings.

DESCRIPTION OF THE PREFERRED EMBODIMENTS

A description will be given of a first embodiment of a laser diode driving circuit according to the present invention by referring to FIG. 1.

Figure 1:
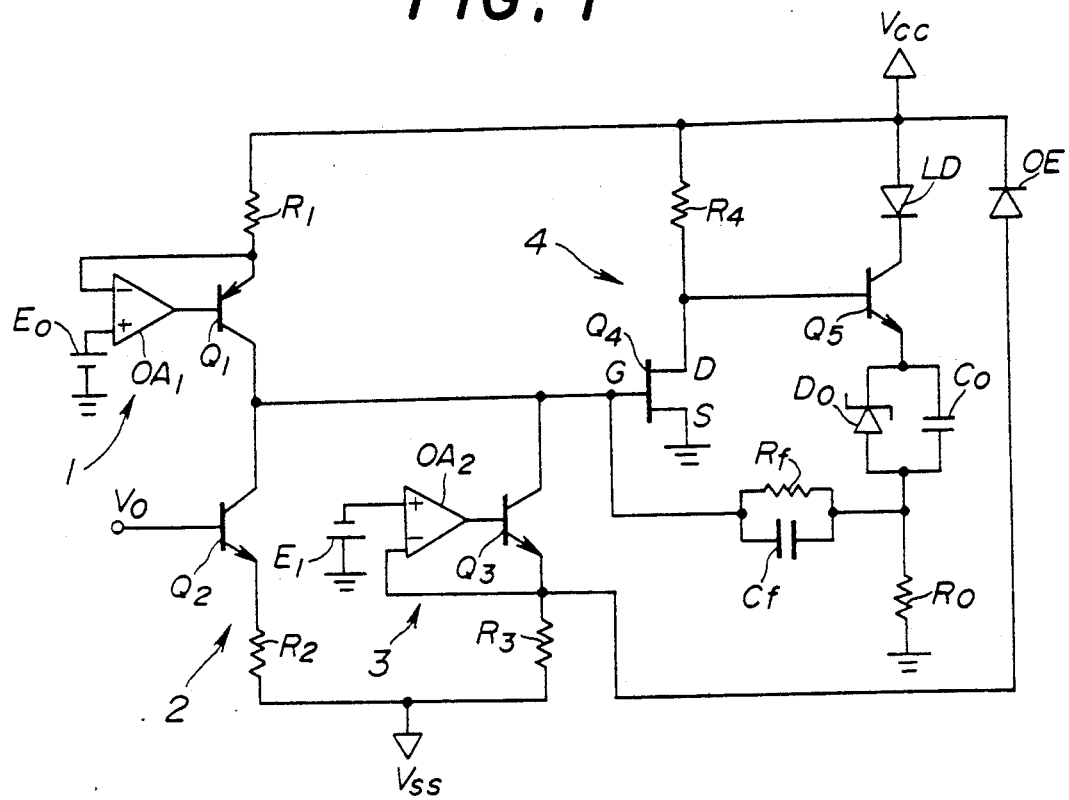
FIG. 1 is a circuit diagram showing a first embodiment of a laser diode driving circuit according to the present invention.

In FIG. 1, a transistor Q1, a resistor R1, an operational amplifier OA1 and a voltage source E0 form a current source 1. This current source 1 is applied with a power source voltage Vcc and supplies a predetermined current from a collector of the transistor Q1. On the other hand, a transistor Q2 and a resistor R2 form a converting circuit 2 for converting an input signal into a current. The converting circuit 2 is connected to a power source Vss. This converting circuit 2 converts an external light emission instruction signal V0 which is applied to a base of the transistor Q2 into a light emission instruction signal current V0/R2. Hence, a light emission instruction signal current which varies depending on the light emission instruction signal V0 flows from the current source 1 to a collector of the transistor Q2.

A light receiving element OE which forms a photoelectric conversion means monitors a portion of an optical output of a laser diode LD. For example, a photodiode may be used as the light receiving element OE. Hence, a photocurrent which is proportional to the optical output of the laser diode LD is induced in the light receiving element OE. This photocurrent induced in the light receiving element OE can be described by kP, where P denotes the optical output of the laser diode LD and k denotes a proportional constant.

A transistor Q3, an operational amplifier OA2, a resistor R3 and a voltage source E1 form a current source 3. The predetermined current from the current source 1 flows to a collector of the transistor Q3. The photocurrent which is induced in the light receiving element OE flows to an emitter of the transistor Q3 and varies a collector current of the transistor Q3 by kP.

A field effect transistor (FET) Q4 and a resistor R4 form a source grounding circuit 4. In addition, the laser diode LD, the light receiving element OE, the current source 3, the source grounding circuit 4 and a driving transistor Q5 form a photoelectric negative feedback loop. The FET Q4 amplifies a current which corresponds to a difference between the light emission instruction signal current from the converter circuit 2 and a current from the current source 3, and applies the amplified current to a base of the driving transistor Q5. A forward current from the power source Vcc flows to the laser diode LD via the driving transistor Q5, a circuit which is made up of a Zener diode D0 and a capacitor C0 which are connected in parallel, and a resistor R0, and as a result, the laser diode LD emits light. The resistor R0 detects the forward current of the laser diode LD and converts the forward current into a voltage which is negatively fed back to a gate of the FET Q4 via a circuit which is made up of a resistor Rf and a capacitor Cf which are connected in parallel.

A current deviation $\Delta I$ at the input of the FET Q4 can be described by $\Delta I = V0/R2 - kP$. This current deviation $\Delta I$ generates a voltage deviation Rf x $\Delta I$ across the resistor R0 via the circuit which is made up of the resistor Rf and the capacitor Cf. Accordingly, the forward current of the laser diode LD changes by (Rf/R0) x $\Delta I$.

Therefore, the optical output P of the laser diode LD can be described by the following when a differential quantum efficiency is denoted by N.

$$P = N \times (Rf/R0)(V0/R2 - kP)$$
$$= N \times (Rf/R0)(V0/R2)/[1 + Nk(Rf/R0)]$$

When N=0.6 mW/mA, k=0.02 mA/mA, Rf=820 k$\Omega$ and R0=10 $\Omega$, P $\propto$ V0 because Nk(Rf/R0)=984>1.

The above described operation applies for the D.C. deviation. When the frequency at which the loop gain of the photoelectric negative feedback loop becomes "1" increases, an input capacitance of the FET Q4, a stray capacitance which is introduced parallel to the resistor R4 and the like prevent the high-speed operation of the circuit. For example, when the mutual conductance of the FET Q4 is 10 m, the input capacitance of the FET Q4 is 3 pF and the stray capacitance of the resistor R4 is 1 pF, the voltage gain of the FET Q4 is approximately "16" even when the 1 pF stray capacitance of the resistor R4 becomes dominant at a frequency of 100 MHz. For this reason, a phase delay caused by the input capacitance of the FET Q4 will not occur unless the 3 pF input capacitance of the FET Q4 becomes approximately equal to 16×Cf. Hence, when the frequency at which the loop gain of the photoelectric negative feedback loop becomes "1" is set to 100 MHz, for example, Cf×16 >3 pF because Cf≈2 pF, and it is possible to realize a high-speed operation even at the frequency of 100 MHz.

Figure 2:
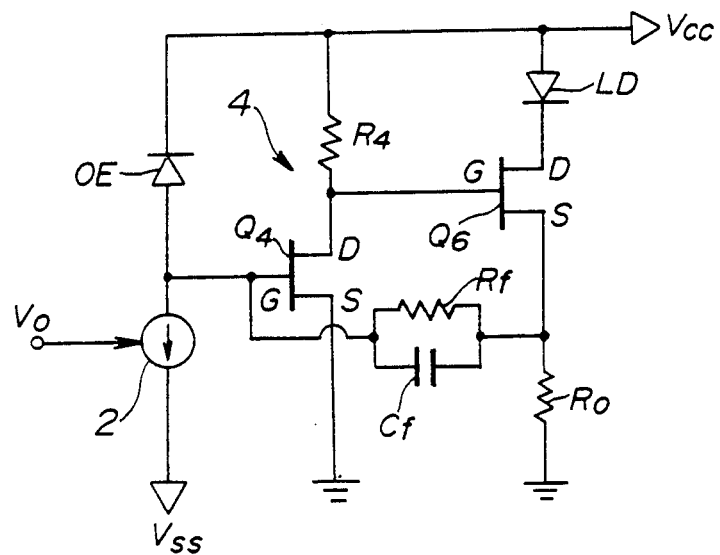
FIG. 2 is a circuit diagram showing a second embodiment of the laser diode driving circuit according to the present invention.

Next, a description will be given of a second embodiment of the laser diode driving circuit according to the present invention by referring to FIG. 2. In FIG. 2, those parts which are essentially the same as those corresponding parts in FIG.1 are designated by the same reference numerals, and a description thereof will be omitted.

In this second embodiment shown in FIG. 2, the light receiving element OE and the converting circuit 2 are connected in series. In addition, the current sources 1 and 3 and the circuit which is made up of the Zener diode D0 and the capacitor C0 are omitted. Furthermore, a driving FET is used in place of the driving transistor Q5.

According to this second embodiment, a current which corresponds to a difference between the light emission instruction signal current from the converting circuit 2 and the photocurrent from the light receiving element OE is applied to the source grounding circuit 4. Otherwise, the operation of the circuit is basically the same as that of the first embodiment described above Further, the present invention is not limited to these embodiments, but various variations and modifications may be made without departing from the scope of the present invention.

What is claimed is:

1. A laser diode driving circuit for driving a laser diode comprising:
a driving transistor controlling a forward current of the laser diode;
photoelectric conversion means for receiving an optical output of the laser diode and for outputting a photocurrent proportional to the optical output;
converting means for converting an external light emission instruction signal into a light emission instruction signal current; and
a source grounding circuit amplifying a current which corresponds to a difference between the light emission instruction signal current from said converting means and the photocurrent from said photoelectric conversion means, so as to output an amplified current,
said source grounding circuit applying the amplified current to said driving transistor and controlling said driving transistor so that the light emission instruction signal current becomes equal to the photocurrent.

2. The laser diode driving circuit as claimed in claim 1, wherein said driving transistor includes a field effect transistor.

3. The laser diode driving circuit as claimed in claim 1, wherein said photoelectric conversion means includes a light receiving element.

4. The laser diode driving circuit as claimed in claim 1, which further comprises a first terminal supplying a first power source voltage, a second terminal supplying a second power source voltage and a third terminal connected to ground, said driving transistor being coupled is series with the laser diode between said first and third terminals, said photoelectric conversion means being coupled to said first terminal, said converting means being coupled to said second terminal, said source grounding circuit being coupled to said first and third terminals, said driving transistor and said converting means.

5. The laser diode driving circuit as claimed in claim 4, wherein said photoelectric conversion means is coupled between said first terminal and said converting means.

6. The laser diode driving circuit as claimed in claim 4, which further comprises a first current source coupled between said first terminal and said converting means, and a second current source coupled to said second terminal, said source grounding circuit and a node between said first current source and said converting means.

7. The laser diode driving circuit as claimed in claim 6, wherein said photoelectric conversion means is coupled between said first terminal and said second current source.

* * * * *